(12) United States Patent
Yazdy

(10) Patent No.: US 6,639,425 B2
(45) Date of Patent: Oct. 28, 2003

(54) PROCESS AND TEMPERATURE COMPENSATION CIRCUIT FOR INTEGRATED RF SWITCHING

(75) Inventor: Mostafa R. Yazdy, Los Angeles, CA (US)

(73) Assignee: Xerox Corporation, Stamford, CT (US)

( * ) Notice: Subject to any disclaimer, the term of this patent is extended or adjusted under 35 U.S.C. 154(b) by 142 days.

(21) Appl. No.: 10/025,475

(22) Filed: Dec. 26, 2001

(65) Prior Publication Data
US 2003/0116828 A1 Jun. 26, 2003

(51) Int. Cl.⁷ ........................................... H03K 19/0175
(52) U.S. Cl. ........................ 326/82; 326/83; 327/108; 327/378
(58) Field of Search ............................ 326/82, 83, 86, 326/89, 90; 327/108, 378, 374–377

(56) References Cited

U.S. PATENT DOCUMENTS

| 4,742,249 A | * | 5/1988 | Alpaiwalla et al. ......... 327/484 |
| 5,757,065 A | | 5/1998 | Buhler et al. ............... 257/653 |
| 6,218,909 B1 | * | 4/2001 | Eban ...................... 331/117 R |

* cited by examiner

Primary Examiner—Don Le
(74) Attorney, Agent, or Firm—Philip T. Virga

(57) ABSTRACT

An electronic driver circuitry for an RF switch diode D1 used in Acoustic Ink Jet Printing (AIP) systems that compensates and cancels out undesired variations and non-idealities is disclosed. The electronic driver circuitry consists of a second RF switch diode D2 used as a compensation diode that is placed in close physical proximity to the RF switch diode D1 used for RF switching. To compensate for undesirable variations in the RF switch diode D1, the driver circuitry is designed such that the current in the RF switch diode D2 is adjusted in an opposite direction to cancel the unwanted variations of the RF switch diode D1.

20 Claims, 3 Drawing Sheets

PROCESS AND TEMPERATURE COMPENSATION CIRCUIT FOR INTEGRATED RF SWITCHING

CROSS REFERENCE TO RELATED APPLICATION

Attention is directed to copending application Ser. No. 10/025,476 filed Dec. 26, 2001 entitled, "Process Insensitive Electronic Drive Circuitry for Integrated RF Switching." The disclosure of this reference is hereby incorporated in its entirety.

BACKGROUND OF THE INVENTION

In most RF applications, discrete P-i-N diodes are used in RF switch arrays because they have the correct diode characteristics to operate correctly. However, using discrete P-i-N diodes increases both the size and the cost of the RF switch arrays. Another impact of using discrete P-i-N diodes is that a discrete RC circuit is needed to isolate the P-i-N diode from a driver chip that will be used to drive the P-i-N diode. Therefore, it would be preferable to use integrated diodes in building RF switch arrays but current technological limitations have prevented their use. This is because current CMOS integrated diodes are not capable of sustaining the performance requirements necessary for the RF switch array.

To solve some of the above stated problems a technique has been found which allows for the fabrication of a CMOS integrated diode, such as that disclosed in U.S. Pat. No. 5,757,065 and assigned to the assignee of the present application. U.S. Pat. No. 5,757,065 entitled HIGH VOLTAGE INTEGRATED CIRCUIT DIODE WITH A CHARGE INJECTING NODE discloses using an injecting node in a CMOS integrated diode for producing diode characteristics more closely resembling the characteristics of a discrete P-i-N diode. Additionally, these integrated P-i-N diodes need electronic driver circuitry for biasing the injecting node for proper switching. The P-i-N diode characteristics, which in turn directly determine the efficiency of RF switching in Acoustic Ink Jet Printing (AIP) systems, are extremely sensitive to temperature and process parameters variations. Therefore what is needed is a design for the driver circuitry such that those inefficiencies due to process parameters and temperatures variations are compensated and canceled out.

SUMMARY OF THE INVENTION

In accordance with the present invention, there is provided an electronic driver circuitry for an RF switch diode D1 used in Acoustic Ink Jet Printing (AIP) systems that compensates and cancels out undesired variations and non-idealities. The electronic driver circuitry consists of a second RF switch diode D2 used as a compensation diode that is placed in close physical proximity to the RF switch diode D1 used for RF switching. To compensate for undesirable variations in the RF switch diode D1, the driver circuitry is designed such that the current in the RF switch diode D2 is adjusted in an opposite direction to cancel the unwanted variations of the RF switch diode D1.

BRIEF DESCRIPTION OF THE DRAWINGS

The objects, features and advantages of the invention will become apparent upon consideration of the following detailed disclosure of the invention, especially when it is taken in conjunction with the accompanying drawings wherein.

DETAILED DESCRIPTION OF THE INVENTION

Figure 1:
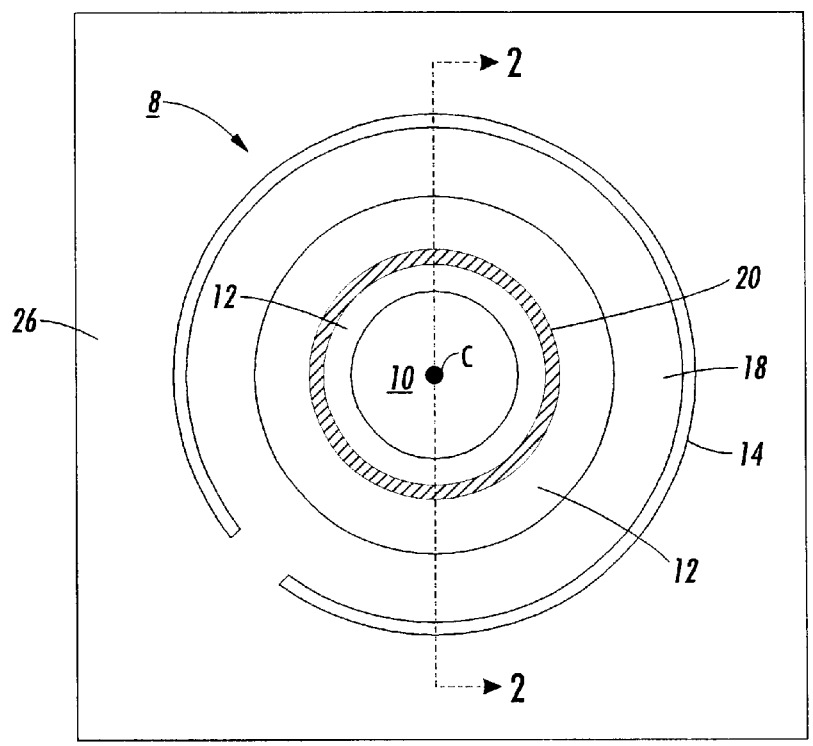
FIG. 1 is top view of a CMOS integrated circuit diode.
Figure 2:
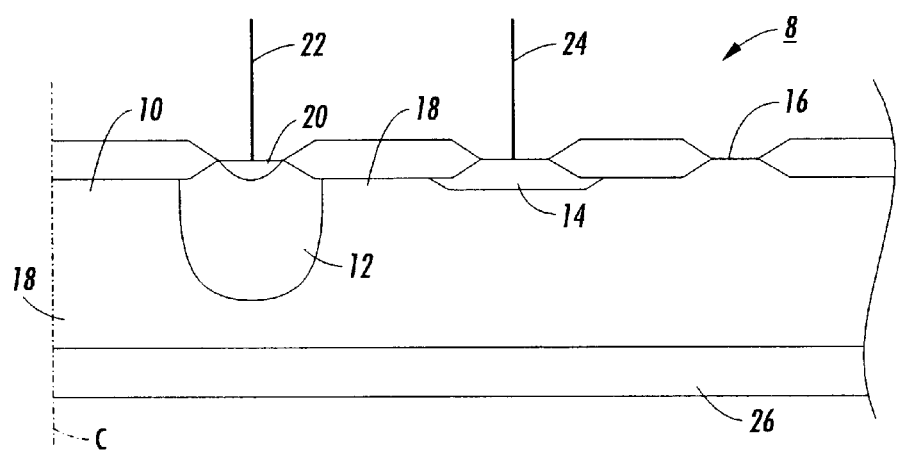
FIG. 2 is a cross-sectional view of the CMOS integrated circuit diode shown in FIG. 1 and taken through cross-section line 2—2.

Turning now to FIG. 1, a top view of a CMOS integrated circuit diode 8 for use as a RF switch diode in the present invention is shown. FIG. 2 shows a cross-sectional view of the CMOS integrated circuit diode 8 shown in FIG. 1 and taken through cross-section line 2—2. RF switch diodes must have very low on-impedance and at the same time they must have very low capacitance for efficient and fast switching. However, these two parameters contradict each other in that by making the diodes' on-resistance very low, the diode must have a very large area, which increases its capacitance drastically. Regular N+ or P+ integrated CMOS diodes have low breakdown voltages and high capacitance values.

Referring to FIGS. 1 and 2, adding an injecting node 14 to the integrated diode 8 solves the problem. The RF switch diode D1 8 itself is a cylindrical device with centerline C. The RF switch diode D1 8 is constructed by implanting a ring to form an n-well cathode 12 in a substrate comprised of p+ substrate 26 and p− epi 18 leaving a p− epi anode 10 in the center. The n-well cathode 12 is connected to electrically by a n+ metal contact 20. Using the n+ metal contact 20 the n-well cathode 12 can now be connected to using a metal line 22. The p− epi anode 10 of the diode 8 created by the n-well cathode 12 is connected to ground via a topside p− epi anode contact 16 shown in FIG. 1. The p+ substrate 26 is connected to ground via a backside wafer contact (not shown). Decreasing the depth of the p− epi 18 increases the capacitance and off impedance, and decreases the breakdown voltage.

The RF switch diode D1 8 defines a n+ injecting node 14 forming a broken ring outside of the n-well cathode 12 and separated from it by a portion of the p− epi 18 region. The distance the n+ injecting node 14 is located from the n-well cathode 12 vary depending on what breakdown voltage is desired. The n+ injecting node 14 alters the characteristics of the RF switch diode D1 8 by biasing the diode in either a forward biased mode or a reverse biased mode during operation of the RF switch diode D1 8. When the n+ injecting node 14 is forward biased there is a negative bias on the n+ injecting node 14 as referenced against the p− epi anode 10 and the p− epi 18. The forward bias on the injecting node 14 injects electrons into both the p− epi 18 and the p− epi anode 10. The n-well cathode 12 then drops to a voltage of approximately negative 0.7 volts, or 0.7 volts below the p− epi anode 10 and the p− epi 18, and the diode 8 remains turned on as long as there are electrons in the p− epi 18 and the p− epi anode 10. The injected electrons from the forward biased n+ injecting node 14 reduce the on-impedance of the RF switch diode D1 8. This biasing and impedance setting feature allows the diode to handle a large RF voltage signal when the diode is turned off and to handle a large RF current signal when the RF switch diode D1 8 is turned on.

Figure 3:
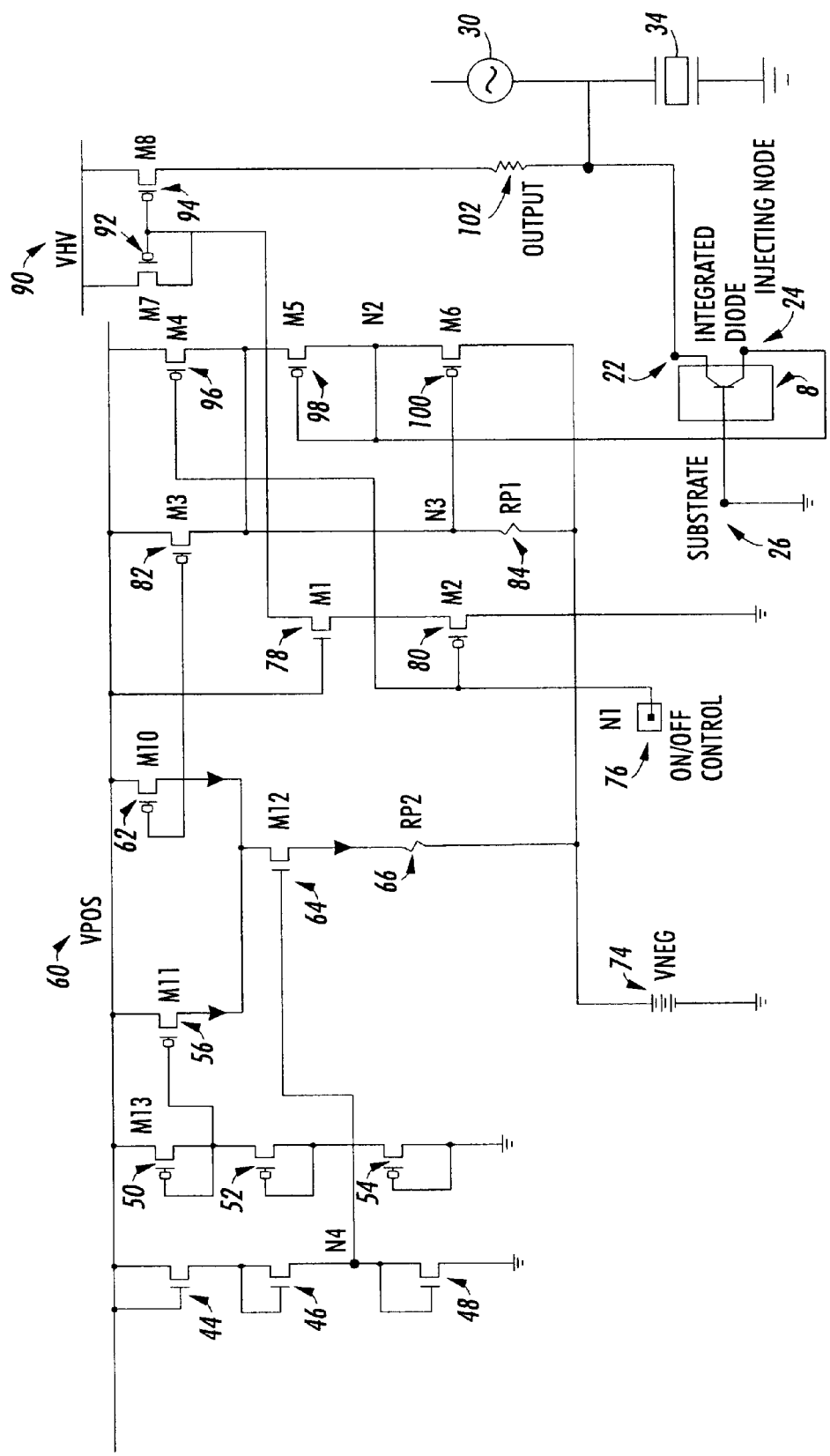
FIG. 3 is an electrical schematic showing biasing circuitry for the CMOS integrated circuit diode that compensates and cancels out undesired variations and non-idealities according to the present invention.

Referring now to FIG. 3, there is shown electronic driver biasing circuitry for the RF switch diode D1 8. The biasing circuitry compensates and cancels out undesired variations and non-idealities according to the present invention. In accordance with the present invention, the injection node contact 24 must be biased properly to turn the RF switch ON or OFF. For the ON situation, the injecting node contact 24 must be biased to a voltage approximately −0.7 volts with respect to the grounded substrate 26 to inject electrons into p− epi 18. The injected minority carriers reduce the on-resistance more than if the injection node 14 was not available. To turn the diode 8 OFF, the injecting node 14 must be biased to a positive voltage with respect to grounded substrate 18. Referring once again to FIG. 3, a digital signal is applied to node N1 76 (ON/OFF control node) which determines the state of the integrated RF switch diode D1 8. When this signal is "LOW", the voltage of the node N2 36 is positive and diode 8 is OFF. When this signal is "HIGH", the voltage of node N2 36 is about −0.7, so the minority carriers are injected into substrate and the integrated RF switch diode D1 8 is on.

Turning once again to FIG. 3, the RF switch diode D1 8 is turned off when the PMOS FET's M5 98 and M6, 100 respectively are turned off, thereby allowing no current to flow to the injection node 24. This is accomplished by applying a zero bias voltage on node N1 76 which turns on the PMOS FET's M2 80 with the NMOS FET M1 78 in the ON state do to the bias voltage from VPOS 60. By way of example but not of limitation, the voltage of VPOS 60 is 5 volts. With both M1 78 and M2 80 in the ON state, PMOS FET's M7 92 and M8 94 are turned on by the bias voltage supplied by VNEG 74. With M7 92 and M8 94 in the ON state, voltage VHV 90 through resistor 102 allows power to be switched from the RF power source 30 to the transducer 34. The zero voltage on none N1 76 turns on M4 96 providing a positive voltage on node N3 which turns OFF M6 100. The voltage turns OFF the RF switch diode D1 8.

Likewise, the RF switch diode D1 8 is turned on when the PMOS FET M6 100 is turned on, thereby allowing current to flow to the injection node 24. This is accomplished by applying a positive bias voltage (typically 5 volts) on node N1 76 which turns off the PMOS FET M2 80. With M2 80 in the off state, PMOS FET's M7 92 and M8 94 are not turned on by the bias voltage supplied by VNEG 74. With M6 100 in the onON state, the RF switch diode D1 8 is closed creating a short circuit for the RF signal 30 a path from node 22 to the substrate 18 to ground allowing no power to the transducer 34.

Also the positive (5V) voltage on node N1 76 turns off M4 96 so there is no large current in resistor RP1 84 due to M4 96. The small current in RP1 84 is only provided by transistor M3 82 such that the voltage of node N3 is negative (by Vneg 74) allowing M6 100 to be on to provide a current path for RF switch diode D1 8 which is turned on.

Therefore, the on-impedance of the RF switch diode D1 8 can be varied by changing the amount of current injected into the n+ injecting node 14. When there is no current, the RF switch diode D1 8 acts as a normal two-terminal diode because there are no injected electrons to reduce the on-impedance. However, as the current into the n+ injecting node 14 rises, more electrons are injected and the on-impedance is lowered. When the n+ injecting node 14 is reverse biased there is a positive bias on the n+ injecting node 14 as referenced against the p− epi 18. When there is a forward bias on the n+ injecting node 14 no electrons are injected into the p− epi 18. The RF switch diode D1 8 then behaves as it normally would, however with the n-well cathode 12 and p− epi 18 doping values the RF switch diode D1 8 has a low reversed biased capacitance.

Turning once again to FIG. 3, in the described driver circuitry, a PMOS transistor M6 100 and resistor RP1 84 are provided such that when the RF switch diode D1 8 is on, the current in the RF switch diode D1 8 is the same as the current in transistor M6 100. In accordance with one embodiment of the present invention, the RF switch diode's 8 current is basically controlled by controlling the current in M6 100. The current in M6 100 itself is controlled by the voltage Vgs (voltage between gate and source) of M6 100 (which is proportional to the voltage drop across RP1 84), $K_P$ the gain factor and $V_T$ the threshold voltage of PMOS transistor M6 100. RP1 84 is a "Poly" resistor and the voltage drop across it is affected by the value of this resistor and the current through this resistor which is the same current in transistor M3 82.

The values of RP1 84, $K_P$ and $V_T$ can vary from one fabricated lot to another and may also be changed due to temperature change and variations in power supply Vpos. These variations can change the current in different RF diode switches 8 and ultimately degrade the switch array uniformity. To compensate for these undesirable variations, the driver circuitry is designed such that the current in M3 82 and therefore the Vgs voltage and current of M6 100 (and therefore the current in the RF diode switch 8) is adjusted in an opposite direction to cancel the unwanted variations.

Referring once again to FIG. 3, a second "poly" resistor RP2 66 is added to compensate for variation in the value of the poly-resistor RP1 84. Although during fabrication of the driver circuitry the values of RP1 84 and RP2 66 may change drastically due to process or temperature variations. However, their ratio remains almost constant because their variation (increase or decrease) are in the same direction. Therefore, if value of RP1 84 is increased due to process variations, the value of RP2 66 will vary by the same rate since it is fabricated on the same wafer. The compensation for the resistance of RP1 84 by RP2 66 is due to the connection of PMOS transistor M10 62 to the PMOS transistor M3 82. As shown in FIG. 3., the transistors M10 62 and M3 82 form a "Current Mirror" such that current in M3 82 follows the current in M10 62. The transistor M10 66 is connected to the resistor RP2 66 through an NMOS transistor M12 64. Therefore, an increase in the resistance value of RP2 66 will cause a decrease in the current $i_{m10}$ at transistor M10 62. Since M3 is acts as a current mirror, the current in $i_{m3}$ will also decrease and compensate for an increase in the resistance RP1 84. Since the ratio between RP1 82 and RP2 66 are always approximately the same, the gate to source voltage Vgs of M6 100 is always held constant and therefore the current in M6 100 is constant and therefore the RF switch diode's 8 current is held constant.

Turning once again to FIG. 3, a cascaded branch of PMOS transistors 50, 52, 54 are added to compensate for variations in $K_P$ and $V_T$ in the RF switch diode D1 8. Once again during fabrication of the driver circuitry the values of $K_P$ and $V_T$ may change drastically for PMOS transistor M6 100 due to process or temperature variations. However, cascaded PMOS transistors 50, 52, 54 will have the same $K_P$ and $V_T$ variations as the $K_P$ and $V_T$ values of M6 100 due to process variations since they are all fabricated simultaneously on the same wafer. The compensation for the $K_P$ and $V_T$ values of M6 100 by cascaded PMOS transistors 50, 52, 54 is due to the connection of PMOS transistor M13 50 to the PMOS transistor M11 56. As shown in FIG. 3., the transistor M13 50 and M11 56 also form a "Current Mirror" such that current in M11 50 follows the current in M13 50. If during fabrication, the $K_P$ and $V_T$ values of M6 100 is increased or decreased, so are all the PMOS transistors 50, 52 and 54.

The PMOS transistors 50, 52 and 54 may be represented as a branch of resistances Rm in series. When $K_P$ is increased, the Rm's are decreased resulting in less resistance in the branch and thus an increase in current $i_{m13}$ at PMOS transistor M13 50. Since M13 50 and M11 56 act as a current mirror, the current in $i_{m11}$ will also increase. As shown in FIG. 3, PMOS transistor M11 56 is connected to PMOS transistor M10 62 such that the value of the current $i_{m10}$ is equal to the current $i_{m12}$ in M12 64 minus the current $i_{m11}$ in M11 62. Therefore, if the current in $i_{m11}$ increases, the current in $i_{m10}$ decreases and as described above, the current $i_{m10}$ is equal to the current $i_{m3}$. With an increase in $K_P$ a resulting decrease in $i_{m3}$ occurs resulting in a drop of the Vgs across transistor M6 100 and $i_{m6}$ once again remains constant and the current in the RF switch diode remains constant.

Similarly, when $V_T$ is increased, the Rm's are increased resulting in more resistance in the branch and thus a decrease in current $i_{m13}$ in PMOS transistor M13 50. Current $i_{m13}$ in M11 56 will also be decreased resulting in larger current in M10 62 and thus in M3 82 which increases the gate voltage of M6 100 and canceling the effect of increase in $V_T$ such that the current in the RF switch diode D1 8 remains constant.

To compensate for variations in the power supply Vpos 60, a branch of cascaded NMOS transistors 44, 46, 48 are added to the circuit and connected to the NMOS transistor M12 64, as shown in FIG. 3. If the Vpos 60 voltage varies up or down, so does the voltage at node N4. The cascaded NMOS transistors 44, 46, 48 act as a voltage divider circuit such that an increase for example in Vpos 60 results in an increase in the voltage of N4 and hence the current of transistor M12 64. Similarly an increase in current appears at the PMOS transistor M11 56 due to cascaded PMOS transistors 50, 52 and 54 acting as a voltage divider. Since the current $i_{m10}$ is equal to the current $i_{m11}$ subtracted from the current im12, and the currents are always constant, the current at $i_{m10}$ will remain constant. When the current at $i_{m3}$ is constant, Vgs will also be constant and thus the current $i_{m6}$ and the RF switch diode current will once again be constant.

Lastly, to compensate for variations in the power supply Vneg 74, RP2 66 and M12 64 play a role. Referring once again to FIG. 3., if the power supply Vneg 74 varies, its variations affects the voltage of node N3 which changes the current in M6 100 and thus the current in RF switch diode D1 8. For example of the absolute value of the Vneg decreases the voltage of N3 decreases as well. But the decrease in Vneg increases the current in RP2 since it is connected to the same Vneg 74. The increase in this current will increase $i_{m3}$, the current in M3 82 such that the voltage of node N3 remains constant making the current in M6 100 and thus the current in RF switch 8 constant.

Figure 4:
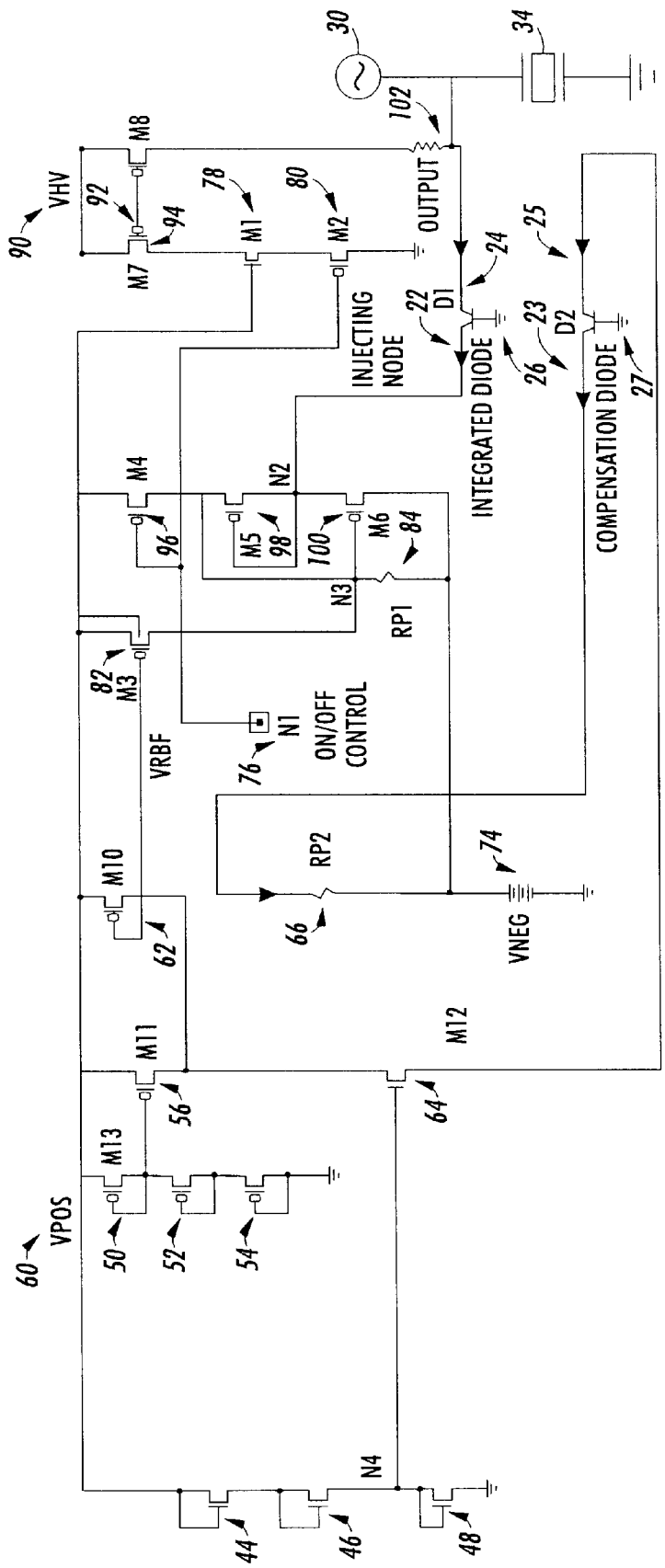
FIG. 4 is another embodiment in accordance with the present invention.

Referring now to FIG. 4 there is shown a driver circuitry having all the same components with same numerals as shown in FIG. 3 with the addition of a second RF switch diode D2 in accordance with the present invention. The adding of another P-i-N diode (referred to as a compensation diode) monitors the current in the main integrated RF switch diode D1 8 and compensates for variation in the current of the RF switch diode D1 8 which is particularly sensitive to process and temperature variations.

Turning once again to FIG. 4, the compensation RF diode D2 is located in series between the FET M12 64 and the poly-resistor RP2 66. The Diode D2 is located in close physical proximity such that its characteristics mirror the characteristics of the RF switch diode D1 8 as closely as possible so it tracks the current as accurately as possible. For example, if the current in the RF switch diode tends to increase or decrease because of higher or lower temperature respectively, there will be a similar change in the current of compensation diode D2. The change in this current changes the current in M12 64 thus the current in M10 62 and the current in M3 82 wherein the bias voltage on node N3 is adjusted to cause a change in the RF switch diode D1 8 in an opposite direction, counterbalancing the current changes and thus keeping the current unchanged. It should be noted that the compensating diode D2 has the configuration 23, 25 and 27 the same as RF switch diode D1 8 22, 24 and 26 to mirror the current effect in an opposite direction.

As described, the biasing voltage of node N2 is directly determined by various process parameters which can vary significantly in different process lots. Also, this voltage is affected by temperature and power supply variations. As a result the injecting current and RF diode characteristics are very sensitive to these variations which can drastically degrade the speed and efficiently of RF switching in AIP systems. Lastly, the described technique is applicable to both MOS and bipolar circuitry and to the complement of the circuitry illustrated.

While there have been shown and described what are at present considered embodiments of the invention, it will be obvious to those skilled in the art that various changes and modifications may be made therein without departing from the scope of the invention as defined by the appended claims. While the present invention will be described in connection with a preferred embodiment and method of use, it will be understood that it is not intended to it the invention to that embodiment or procedure. On the contrary, it is intended to cover all alternatives, modifications and equivalents as may be included within the spirit and scope of the invention as defined by the appended claims.

What is claimed is:

1. An electronic driver circuitry for an integrated RF switching diode, comprising:

a first CMOS integrated circuit diode for RF switching;

a second CMOS integrated circuit diode electrically connected to said first CMOS integrated circuit diode to compensate for process and temperature variations by supplying an equal yet opposite current for canceling out variations in said first CMOS integrated circuit diode;

a first PMOS transistor and a first poly-resistor circuit electrically connected to and for switching ON/OFF said CMOS integrated circuit diode, said first PMOS transistor having an equal current as said CMOS integrated circuit diode;

a second poly-resistor in electrically connected with said first poly-resistor for compensating variations in resistance;

a plurality of cascaded PMOS transistors in circuit connection with said first PMOS transistor for compensating variations in gain and voltage threshold of said CMOS integrated circuit diode; and a plurality of cascaded NMOS transistors in circuit connection with said plurality of PMOS transistors for compensating for variations in supply voltage, wherein all compensation cancels out undesired variations keeping current across the CMOS integrated circuit diode constant.

2. The electronic driver circuitry of claim 1 wherein said resistance compensation is due to a connection of a second PMOS transistor to a third PMOS transistor, said second PMOS transistor and said third PMOS transistor connected such that current in said second PMOS transistor follows the current in said third PMOS transistor and said third transistor is connected to said second poly-resistor through a fourth NMOS transistor.

3. The electronic driver circuitry of claim 2 wherein a change of resistance value of said second resistance causes an opposite change of current in said third PMOS transistor with said current in said second PMOS transistor having like current thereby compensating for an increase in resistance of first poly-resistor wherein source voltage and current of said first PMOS transistor is held constant said current across the CMOS integrated circuit diode constant.

4. The electronic driver circuitry of claim 3 wherein said plurality of cascaded PMOS transistors are electrically connected to a fifth PMOS transistor electrically connected to said third PMOS transistor, and said fifth PMOS transistor and said third PMOS transistor connected such that current in said fifth PMOS transistor follows the current in said third PMOS transistor wherein variations in gain and voltage threshold are compensated by the electrical connection of said plurality of cascaded PMOS transistors through said fifth and third PMOS transistors.

5. The electronic driver circuitry of claim 4 wherein said plurality of cascaded PMOS transistors is three PMOS transistors connected in series defining a series voltage divider.

6. The electronic driver circuitry of claim 4 wherein said cascaded NMOS transistors are electrically connected to a sixth NMOS transistor, said sixth NMOS transistor electrically connected to said fifth PMOS transistor wherein variations in supply voltage are compensated through said sixth, fifth, third and second PMOS transistors.

7. The electronic driver circuitry of claim 6 wherein said plurality of cascaded NMOS transistors is three NMOS transistors connected in series defining a series voltage divider.

8. The electronic driver circuitry of claim 6 wherein a change of resistance value of said second resistance causes an opposite change of current in said third PMOS transistor with said current in said second PMOS transistor having like current thereby compensating for an increase in resistance of first poly-resistor wherein negative voltage of said first PMOS transistor is held constant said current across the CMOS integrated circuit diode constant.

9. An electronic driver circuitry for an integrated RF switching diode, comprising:
   a CMOS integrated circuit diode for RF switching;
   a second CMOS integrated circuit diode electrically connected to said first CMOS integrated circuit diode to compensate for process and temperature variations by supplying an equal yet opposite current for canceling out variations in said first CMOS integrated circuit diode;
   a first PMOS transistor and a first poly-resistor circuit electrically connected to and for switching ON/OFF said CMOS integrated circuit diode, said first PMOS transistor having an equal current as said CMOS integrated circuit diode;
   a second poly-resistor in electrically connected with said first poly-resistor for compensating variations in resistance;
   a plurality of cascaded PMOS transistors in circuit connection with said first PMOS transistor for compensating variations in gain and voltage threshold of said CMOS integrated circuit diode; and
   a plurality of cascaded NMOS transistors in circuit connection with said plurality of PMOS transistors for compensating for variations in supply voltage, wherein said resistance compensation is due to a connection of a second PMOS transistor to a third PMOS transistor, said second PMOS transistor and said third PMOS transistor connected such that current in said second PMOS transistor follows the current in said third PMOS transistor and said third transistor is connected to said second poly-resistor through a fourth NMOS transistor whereby all compensation cancels out undesired variations keeping current across the CMOS integrated circuit diode constant.

10. The electronic driver circuitry of claim 9 wherein a change of resistance value of said second resistance causes an opposite change of current in said third PMOS transistor with said current in said second PMOS transistor having like current thereby compensating for an increase in resistance of first poly-resistor wherein source voltage and current of said first PMOS transistor is held constant said current across the CMOS integrated circuit diode constant.

11. The electronic driver circuitry of claim 10 wherein said plurality of cascaded PMOS transistors are electrically connected to a fifth PMOS transistor electrically connected to said third PMOS transistor, and said fifth PMOS transistor and said third PMOS transistor connected such that current in said fifth PMOS transistor follows the current in said third PMOS transistor wherein variations in gain and voltage threshold are compensated by the electrical connection of said plurality of cascaded PMOS transistors through said fifth and third PMOS transistors.

12. The electronic driver circuitry of claim 11 wherein said plurality of cascaded PMOS transistors is three PMOS transistors connected in series defining a series voltage divider.

13. The electronic driver circuitry of claim 12 wherein said cascaded NMOS transistors are electrically connected to a sixth NMOS transistor, said sixth NMOS transistor electrically connected to said fifth PMOS transistor wherein variations in supply voltage are compensated through said sixth, fifth, third and second PMOS transistors.

14. The electronic driver circuitry of claim 13 wherein said plurality of cascaded NMOS transistors is three NMOS transistors connected in series defining a series voltage divider.

15. An electronic driver circuitry for an integrated RF switching diode, comprising:
   a CMOS integrated circuit diode for RF switching;
   a second CMOS integrated circuit diode electrically connected to said first CMOS integrated circuit diode to compensate for process and temperature variations by supplying an equal yet opposite current for canceling out variations in said first CMOS integrated circuit diode;
   a first PMOS transistor and a first poly-resistor circuit electrically connected to and for switching ON/OFF said CMOS integrated circuit diode, said first PMOS transistor having an equal current as said CMOS integrated circuit diode;
   a second poly-resistor in electrically connected with said first poly-resistor for compensating variations in resistance;
   a plurality of cascaded PMOS transistors in circuit connection with said first PMOS transistor for compensating variations in gain and voltage threshold of said CMOS integrated circuit diode; and a plurality of cascaded NMOS transistors in circuit connection with said plurality of PMOS transistors for compensating for variations in supply voltage, wherein said resistance compensation is due to a connection of a second PMOS transistor to a third PMOS transistor, said second PMOS transistor and said third PMOS transistor connected such that current in said second PMOS transistor follows the current in said third PMOS transistor and said third transistor is connected to said second poly-resistor through a fourth NMOS transistor wherein a change of resistance value of said second resistance causes an opposite change of current in said third PMOS transistor with said current in said second PMOS transistor having like current thereby compensating for an increase in resistance of first poly-resistor wherein source voltage and current of said first PMOS transistor is held constant said current across the CMOS integrated circuit diode constant whereby all compensation cancels out undesired variations keeping current across the CMOS integrated circuit diode constant.

16. The electronic driver circuitry of claim 15 wherein said plurality of cascaded PMOS transistors are electrically connected to a fifth PMOS transistor electrically connected to said third PMOS transistor, and said fifth PMOS transistor and said third PMOS transistor connected such that current in said fifth PMOS transistor follows the current in said third PMOS transistor wherein variations in gain and voltage threshold are compensated by the electrical connection of said plurality of cascaded PMOS transistors through said fifth and third PMOS transistors.

17. The electronic driver circuitry of claim 15 wherein said plurality of cascaded PMOS transistors is three PMOS transistors connected in series defining a series voltage divider.

18. The electronic driver circuitry of claim 15 wherein said cascaded NMOS transistors are electrically connected to a sixth NMOS transistor, said sixth NMOS transistor electrically connected to said fifth PMOS transistor wherein variations in supply voltage are compensated through said sixth, fifth, third and second PMOS transistors.

19. The electronic driver circuitry of claim 15 wherein said plurality of cascaded NMOS transistors is three NMOS transistors connected in series defining a series voltage divider.

20. The electronic driver circuitry of claim 15 wherein said first CMOS integrated circuit diode is fabricated in close proximity to said second integrated circuit diode.

* * * * *